(12) United States Patent
Sako et al.

(10) Patent No.: US 9,568,559 B2
(45) Date of Patent: Feb. 14, 2017

(54) DISTRIBUTION ABNORMALITY DETECTING DEVICE, POWER TRANSMISSION AND RECEPTION CONTROL DEVICE, POWER SUPPLY CONTROL DEVICE, AND PACKET STRUCTURE TRANSMISSION CONTROL DEVICE

(71) Applicant: Sony Corporation, Tokyo (JP)

(72) Inventors: Yoichiro Sako, Tokyo (JP); Masao Hori, Tokyo (JP)

(73) Assignee: SONY CORPORATION, Tokyo (JP)

( * ) Notice: Subject to any disclaimer, the term of this patent is extended or adjusted under 35 U.S.C. 154(b) by 731 days.

(21) Appl. No.: 13/779,110

(22) Filed: Feb. 27, 2013

(65) Prior Publication Data

US 2013/0234535 A1 Sep. 12, 2013

(30) Foreign Application Priority Data

Mar. 6, 2012 (JP) ................................. 2012-049279

(51) Int. Cl.
| | | |
|---|---|---|
| H01H 47/00 | (2006.01) | |
| H01H 35/00 | (2006.01) | |
| H01H 83/18 | (2006.01) | |
| H02H 3/02 | (2006.01) | |
| H02H 3/42 | (2006.01) | |
| G01R 31/40 | (2014.01) | |
| H04L 12/54 | (2013.01) | |
| H02J 13/00 | (2006.01) | |
| G01R 19/25 | (2006.01) | |

(52) U.S. Cl.
CPC ............ *G01R 31/40* (2013.01); *H01H 47/002* (2013.01); *H02J 13/0027* (2013.01); *H04L 12/56* (2013.01); *G01R 19/2513* (2013.01); *Y02B 90/245* (2013.01); *Y04S 20/40* (2013.01); *Y10T 307/832* (2015.04)

(58) Field of Classification Search
CPC ....... G01R 31/08; G01R 15/142; H04L 45/00; H02J 9/005; H02H 3/12
USPC ........ 307/126, 52, 11, 19, 24; 324/536, 533, 324/534; 370/403, 399, 402, 401
See application file for complete search history.

(56) References Cited

U.S. PATENT DOCUMENTS

| 5,214,595 A * | 5/1993 | Ozawa ................. G01R 15/142 324/536 |
| 2009/0109985 A1* | 4/2009 | Yazaki ..................... H04L 45/00 370/401 |
| 2011/0185196 A1* | 7/2011 | Asano ................. B60L 11/1809 713/300 |

FOREIGN PATENT DOCUMENTS

| JP | 2003-021649 | 1/2003 |
| JP | 2008-123051 | 5/2008 |
| JP | 2011-142771 | 7/2011 |

* cited by examiner

*Primary Examiner* — Rexford Barnie
*Assistant Examiner* — Jagdeep Dhillon
(74) *Attorney, Agent, or Firm* — Chip Law Group

(57) ABSTRACT

There is provided a distribution abnormality detecting device that detects a distribution abnormality of partitioned power with identification information, the distribution abnormality detecting device being configured to: determine that the distribution abnormality has occurred when an interval of the identification information detected during power distribution is different from an interval specified by the partitioned power.

12 Claims, 9 Drawing Sheets

DISTRIBUTION ABNORMALITY DETECTING DEVICE, POWER TRANSMISSION AND RECEPTION CONTROL DEVICE, POWER SUPPLY CONTROL DEVICE, AND PACKET STRUCTURE TRANSMISSION CONTROL DEVICE

CROSS REFERENCES TO RELATED APPLICATIONS

The present application claims priority to Japanese Priority Patent Application JP 2012-049279 filed in the Japan Patent Office on Mar. 6, 2012, the entire content of which is hereby incorporated by reference.

BACKGROUND

The present disclosure relates to a distribution abnormality detecting device, a power transmission and reception control device, a power supply control device, and a packet structure transmission control device.

A technique of detecting an abnormality when an abnormality occurs during power distribution, for example, when power stealing occurs during power distribution, has been disclosed, for example, JP 2003-021649 A. In the technique disclosed in JP 2003-021649 A, a physical variation amount (specifically, voltage variation) of power supplied to a power supply cable is detected, and when there is an abnormality, supply of power is suspended.

Further, a technique of converting power to distribute into a packet is disclosed in, for example, JP 2008-123051 A and JP 2011-142771 A.

SUMMARY

In the technique disclosed in JP 2003-021649 A, a so-called analog amount such as a physical variation amount (voltage variation) of power is detected. Thus, the detection accuracy is not high, and stability of detection is poor. Further, it is difficult to instantaneously detect the occurrence of an abnormality during power distribution, power stealing, or the like. In JP 2008-123051 A and JP 2011-142771 A, there is no statement about the occurrence of an abnormality during power distribution, power stealing, or the like.

In this regard, the present disclosure is directed to provide a distribution abnormality detecting device, a power transmission and reception control device, a power supply control device, which are capable of instantaneously stably detecting the occurrence of an abnormality during power distribution, and a packet structure transmission control device capable of instantaneously stably detecting a transmission abnormality of a packet structure.

According to an embodiment of the present disclosure, there is provided a distribution abnormality detecting device that detects a distribution abnormality of partitioned power with identification information, the distribution abnormality detecting device being configured to determine that the distribution abnormality has occurred when an interval of the identification information detected during power distribution is different from an interval specified by the partitioned power. Here, the "partitioned power" represents power (specifically, power energy) interposed between predetermined identification information and identification information next to the predetermined identification information. This applies similarly in the following.

According to an embodiment of the present disclosure, there is provided a power transmission and reception control device that transmits and receives partitioned power with identification information, including a distribution abnormality detecting device that detects identification information during power distribution. Transmission and reception of power may be controlled when an interval of the identification information detected by the distribution abnormality detecting device is different from an interval specified by the partitioned power. In the power transmission and reception control device of the present disclosure, a determination on whether or not the distribution abnormality has occurred may be performed by the power transmission and reception control device or the distribution abnormality detecting device. A phenomenon that the interval of the identification information detected by the distribution abnormality detecting device is different from the interval specified by the partitioned power may hereinafter be referred to as an "identification information interval abnormality" for the sake of convenience.

According to an embodiment of the present disclosure, there is provided a power supply control device that supplies partitioned power with identification information, including a distribution abnormality detecting device that detects identification information during power distribution. Supply of power may be controlled when an interval of the identification information detected by the distribution abnormality detecting device is different from an interval specified by the partitioned power. In the power supply control device of the present disclosure, a determination on whether or not the distribution abnormality has occurred may be performed by the power supply control device or the distribution abnormality detecting device.

According to an embodiment of the present disclosure, there is provided a packet structure transmission control device that controls transmission of a packet structure that contains (A) a payload specified by a physical amount and (B) header information including a payload length of the payload. The packet structure transmission control device may determine that an abnormality has occurred in transmission of the packet structure when data that is based on the payload length of the payload obtained by the packet structure transmission control device does not match data related to the payload length in the header information obtained by the packet structure transmission control device. Instead of the payload length (payload amount of actually measured payload) of the payload, the packet length may be used, and the payload length and the packet length may be used. A phenomenon that the data based on the payload length of the payload obtained by the packet structure transmission control device does not match the data related to the payload length in the header information obtained by the packet structure transmission control device may hereinafter be referred to as a "payload length mismatch" for the sake of convenience.

According to the embodiments of the present disclosure described above, in distribution of power, for example, [$n^{th}$ identification information], [$n^{th}$ partitioned power], [$(n+1)^{th}$ identification information], [$(n+1)^{th}$ partitioned power], [$(n+2)^{th}$ identification information], [$(n+2)^{th}$ partitioned power], [$(n+3)^{th}$ identification information], and [$(n+3)^{th}$ partitioned power] sequentially flow through the distribution line. Further, the distribution abnormality detecting device, the power transmission and reception control device, or the power supply control device according to the present disclosure is provided with the distribution abnormality detecting device that detects identification information during power distribution. Thus, due to a certain reason such as power stealing or abnormal leak, for example, when $(n+1)^{th}$ identification information is lost from power which is being distributed, the interval of the identification information detected by the distribution abnormality detecting device is changed to an interval between [$n^{th}$ identification information] and [$(n+2)^{th}$ identification information] even though the interval is originally an interval between [$n^{th}$ identification information] and [$(n+1)^{th}$ identification information] or an interval between [$(n+1)^{th}$ identification information] and [$(n+2)^{th}$ identification information]. In other words, the detected interval of the identification information becomes different from the interval specified by the partitioned power. Thus, the distribution abnormality detecting device, the power transmission and reception control device, or the power supply control device can easily determine that the distribution abnormality has occurred, and can instantaneously stably detect the occurrence of an abnormality during power distribution since the detected interval of the identification information is a sort of digital amount. In the packet structure transmission control device of the present disclosure, when data based on the payload length of the payload (payload amount of actually measured payload) does not match data related to the payload length (numerical data) in the header information, it is determined that an abnormality has occurred in transmission of the packet structure, and thus the occurrence of an abnormality during transmission can instantaneously be stably detected. Here, the "determination" includes a concept of decision. This applies similarly in the following.

Additional features and advantages are described herein, and will be apparent from the following Detailed Description and the figures.

DETAILED DESCRIPTION

Figure 1:
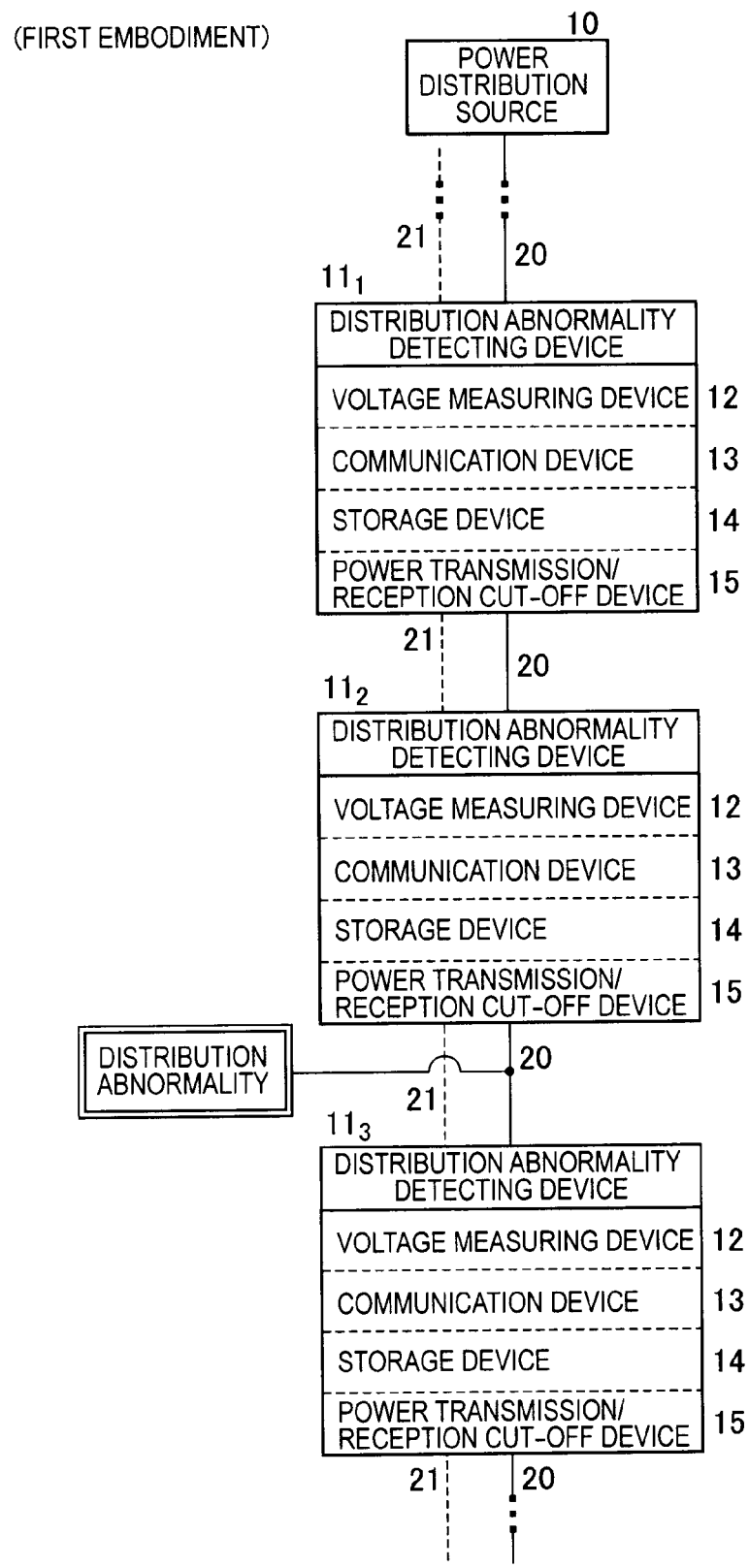
FIG. 1 is a conceptual diagram illustrating a distribution abnormality detecting device or the like according to a first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, exemplary embodiments of the present disclosure will be described with reference to the accompanying drawings, but the present disclosure is not limited to the following embodiments, and various kinds of numerical values or materials in the following embodiment are exemplary. The description will proceeds in the following order.

1. Overall Explanation of Distribution Abnormality Detecting Device, Power Transmission and Reception Control Device, Power Supply Control Device, and Packet Structure Transmission Control Device of Present Disclosure 2. First Embodiment (Distribution Abnormality Detecting Device of Present Disclosure)

3. Second Embodiment (Power Transmission and Reception Control Device and Power Supply Control Device of Present Disclosure)

4. Third Embodiment (Modified Example of First Embodiment or Second Embodiment)

5. Fourth Embodiment (Another Modified Example of First Embodiment or Second Embodiment)

6. Fifth Embodiment (Packet Structure Transmission Control Device of Present Disclosure)

7. Sixth Embodiment (Modified Example of Fifth Embodiment)

8. Seventh Embodiment (Another Modified Example of Fifth Embodiment) and Others

[Overall Explanation of Distribution Abnormality Detecting Device, Power Transmission and Reception Control Device, Power Supply Control Device, and Packet Structure Transmission Control Device of Present Disclosure]

In a distribution abnormality detecting device of the present disclosure, a power transmission and reception control device of the present disclosure, or a power supply control device of the present disclosure (which may hereinafter be referred to collectively as a "distribution abnormality detecting device of the present disclosure or the like"). An interval specified by partitioned power may be a constant time interval $T_0$ (for example, a one-second interval). Alternatively, partitioned power (power energy) may be constant.

Alternatively, in the distribution abnormality detecting device of the present disclosure or the like, a power packet in which identification information and partitioned power are integrated may be configured, the identification information may correspond to a header portion of the power packet, and the partitioned power may correspond to a payload portion of the power packet. In other words, in distribution of power, [identification information], [partitioned power], [identification information], [partitioned power], [identification information], and [partitioned power] sequentially flow through a distribution line.

The length (for example, corresponding to the number of bits, the number of bytes, or the time length) of the header portion of the power packet and the length (corresponding to power energy) of the payload portion are inherently arbitrary but can be set to desired values. In this case, an interval specified by partitioned power may correspond to the power packet length. Here, when the power packet length is constant, the power packet length is equivalent to or synonymous with a "constant time interval." When the power packet length is changed, it is preferable that a change in the power packet length have a regular pattern. The power packet length refers to the sum of the length of the header portion of the power packet and the length of the payload portion of the power packet, but the power packet length may refer to only the length of the payload portion of the power packet according to circumstances. In the packet structure transmission control device, the payload length of the payload and the length of the header information are also inherently arbitrary but can be set to desired values.

In the distribution abnormality detecting device of the present disclosure or the like having the above exemplary form or configuration, when the distribution abnormality detecting device or the like determines that a distribution abnormality has occurred, a form in which distribution or reception of power is suspended (including a form in which distribution or reception of power is restricted; the same hereinafter) is desirable. In the power transmission and reception control device of the present disclosure or the power supply control device of the present disclosure, when the distribution abnormality detecting device is installed at a separate place, a determination result on the occurrence of an identification information interval abnormality or the occurrence of a distribution abnormality by the distribution abnormality detecting device is preferably transferred from the distribution abnormality detecting device to the power transmission and reception control device, the power supply control device, a power distribution source, or a power reception destination in a wired manner (using, for example, a power line communication (PLC) technique) or a wireless manner or a via a communication line or a public line. In other words, the distribution abnormality detecting device of the present disclosure or the like preferably includes a communication device. The power transmission and reception control device, the power supply control device, the power distribution source, or the power reception destination preferably controls transmission and reception of power according to a predetermined procedure. Specifically, for example, transmission and reception of power are preferably suspended, or transmission and reception of power are preferably restricted. Meanwhile, in the packet structure transmission control device of the present disclosure, when it is determined that a payload length mismatch has occurred or an abnormality has occurred in transmission of the packet structure, a form in which transmission of the packet structure is controlled is desirable. Specifically, for example, a form in which transmission of the packet structure is suspended or a form in which transmission of the packet structure is restricted is desirable. When the packet structure transmission control device is installed at a place distant from the packet structure transmission source or the packet structure transmission destination, in order to control, suspend, or restrict transmission of the packet structure, the fact that a transmission abnormality of a packet structure has occurred is preferably transferred from the packet structure transmission control device to the packet structure transmission source or the packet structure transmission destination in a wired manner (using, for example, a PLC technique) or a wireless manner or via a communication line or a public line. In other words, the packet structure transmission control device preferably includes a communication device.

Further, in the distribution abnormality detecting device of the present disclosure or the like having the above form or configuration, when the distribution abnormality detecting device or the like determines that a distribution abnormality has occurred, the distribution abnormality detecting device or the like may have a configuration of suspending (or restricting) supply of power to a power receiving facility/device based on power receiving facility/device information included in identification information, and the power receiving facility/device information included in the identification information may include information of a power receiving facility/device in which suspension (or restriction) of power supply is inhibited. Alternatively, in the distribution abnormality detecting device of the present disclosure or the like having the above form or configuration, a storage device may be disposed, and when the distribution abnormality detecting device or the like determines that a distribution abnormality has occurred, supply of power to the power receiving facility/device may be suspended (restricted) based on power receiving facility/device information stored in the storage device, and the power receiving facility/device information may include information of a power receiving facility/device in which suspension (or restriction) of power supply is inhibited. An identification number allocated to the power receiving facility/device in advance may be used as the power receiving facility/device information which is included in the identification information or stored in the storage device. In both cases, for example, the power receiving facility/device may transmit power receiving facility/device information stored in the power receiving facility/device to the distribution abnormality detecting device of the present disclosure or the like, and the distribution abnormality detecting device of the present disclosure or the like may determine whether power is to be supplied to the power receiving facility/device or whether or not distribution or reception of power is suspended (restricted) based on the received power receiving facility/device information.

Specifically, examples of the power receiving facility/device in which suspension (or restriction) of power supply is inhibited include medical devices such as an aspirator, a bio-oximeter, an oxygen concentrator, a ventilator, an apnea monitor, and an artificial dialyzer, security-related devices such as an electronic lock and a monitoring camera, a computer powered up overnight, and a freezer for business use. The power receiving facility/device refers to not only individual devices but also facilities such as medical institutions such as hospitals, various kinds of research institutions, or various kinds of factories.

Similarly, in the packet structure transmission control device, when it is determined that a transmission abnormality has occurred by the packet structure transmission control device, transmission of the packet structure to the packet structure transmission destination may be suspended (or restricted) based on packet structure transmission destination information included in header information, and the packet structure transmission destination information may include information of a packet structure transmission destination in which suspension (restriction) of packet structure transmission is inhibited. Alternatively, a storage device may be disposed, and when it is determined that a transmission abnormality has occurred by the packet structure transmission control device, transmission of the packet structure to the packet structure transmission destination may be suspended (or restricted) based on packet structure transmission destination information stored in the storage device, and the packet structure transmission destination information may include information of a packet structure transmission destination in which suspension (restriction) of transmission of a packet structure is inhibited. An identification number allocated to the packet structure transmission destination in advance may be used as the packet structure transmission destination information which is included in the header information or stored in the storage device. In both cases, for example, the packet structure transmission destination may transmit packet structure transmission destination information stored in the packet structure transmission destination to the packet structure transmission control device, and the packet structure transmission control device may decide whether or not a packet structure is to be transmitted to the packet structure transmission destination or whether or not transmission of a packet structure is to be suspended (restricted) based on the received packet structure transmission destination information.

In the distribution abnormality detecting device of the present disclosure or the like having the above form or configuration, a voltage value or a current value may be used as the identification information. In other words, a voltage value different from a voltage value of partitioned power, a current value different from a current value of partitioned power, power energy different from partitioned power (power energy) may be used. The simplest configuration of the identification information or the header portion is one (1) bit. Specifically, for example, a voltage value, which flows through a distribution line at predetermined time intervals, lower than a voltage value of partitioned power, a current value lower than a current value of partitioned power, or power energy smaller than partitioned power (power energy) may be used.

For example, the distribution abnormality detecting device of the present disclosure or the like having the above form or configuration may be installed at predetermined distance intervals to be integrated into a distribution line or to be adjacent to a distribution line. In the former case, for example, power from the distribution line may pass through the inside of the distribution abnormality detecting device, and so the identification information may directly be detected by the distribution abnormality detecting device. On the other hand, in the latter case, the identification information may directly be detected, for example, by applying detection of a leakage current from power flowing through a distribution line. For example, a voltage measuring device, a current measuring device, or a power measuring device, which has a known configuration or structure, may be used as the distribution abnormality detecting device.

The "distribution" in the present disclosure includes a concept of power transmission, and the "distribution line" includes a concept of a power transmission line and an electric wire. A spot network scheme, a regular network scheme (a low-voltage network scheme), a low-voltage banking scheme, a main-preliminary line scheme (annular scheme), or a tree-like scheme (radial scheme) may be used as a power distribution network configuration scheme. A high-voltage distribution line (a distribution line which is an overhead electric wire in a residential area or the like and usually used as an incoming line of higher than 50 kVA and equal to or less than 2000 kVA) or a low-voltage distribution line (a distribution line usually used as an incoming line of equal to or less than 50 kVA in an individual house or the like) may be used as the distribution line.

First Embodiment

Figure 2:
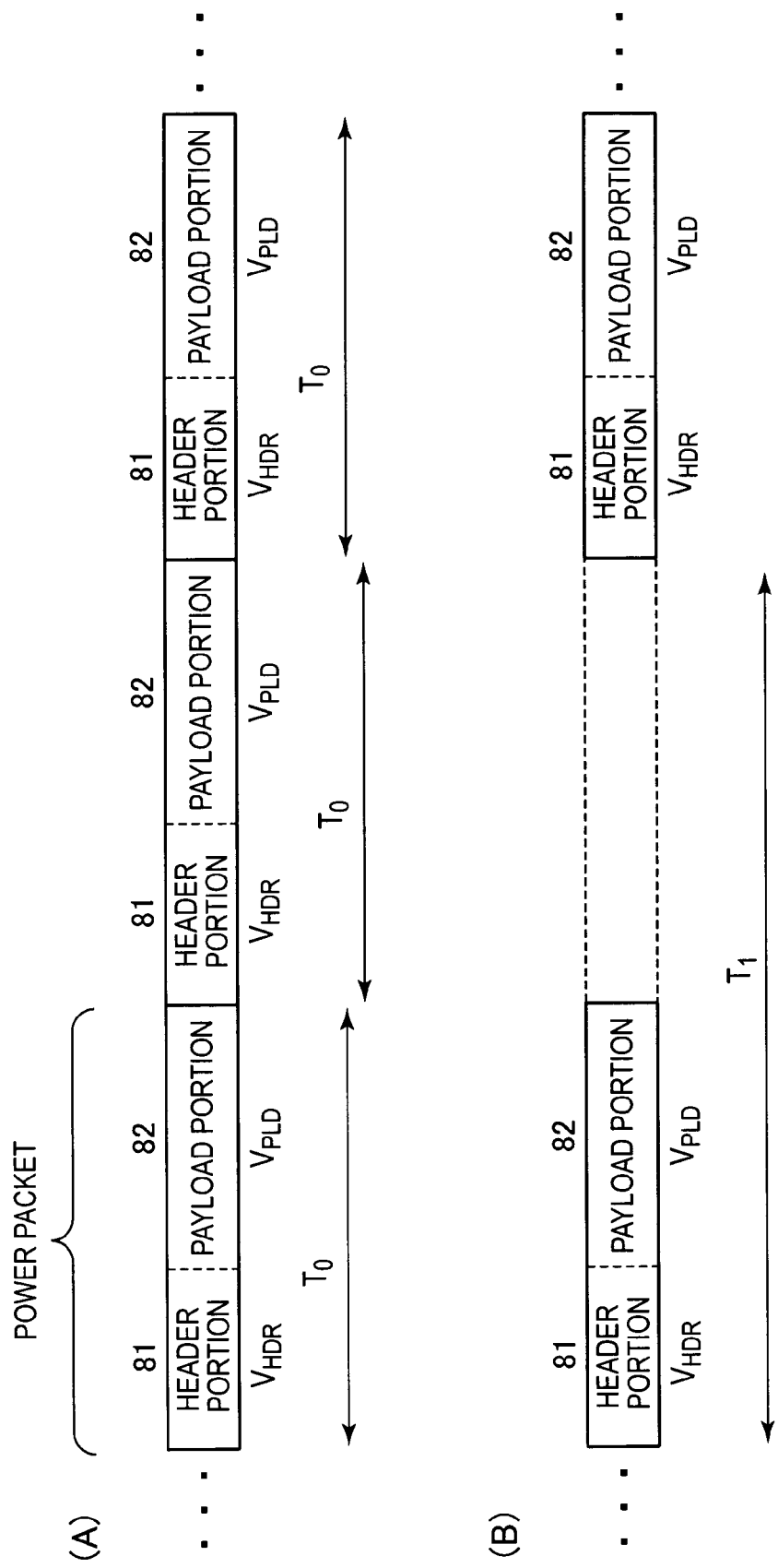
FIGS. 2(A) and 2(B) are conceptual diagrams of partitioned power with identification information.

A first embodiment relates to the distribution abnormality detecting device of the present disclosure. FIG. 1 is a conceptual diagram illustrating a distribution abnormality detecting device or the like according to the first embodiment. FIGS. 2(A) and 2(B) illustrate partitioned power with identification information.

A distribution abnormality detecting device 11 (the distribution abnormality detecting devices $11_1$, $11_2$, and $11_3$ in an example illustrated in FIG. 1) according to the first embodiment is a distribution abnormality detecting device that detects a distribution abnormality of partitioned power with identification information (specifically, power interposed between predetermined identification information and identification information next to the predetermined identification information, and more specifically, power energy). The distribution abnormality detecting device 11 is integrated into a distribution line 20 (a high-voltage distribution line or a trunk distribution line) at predetermined distance intervals. Then, power from the distribution line 20 is caused to pass through the inside of the distribution abnormality detecting device 11, and then identification information is directly detected by the distribution abnormality detecting device 11. Alternatively, the distribution abnormality detecting device 11 is installed at the position adjacent to the distribution line 20, and indirectly detects identification information from power flowing through the distribution line 20. Power from a known power distribution source 10 (for example, various kinds of power generating stations power substations, power substations for power distribution, pole transformers) is transmitted to the distribution line 20.

The distribution abnormality detecting device 11 according to the first embodiment includes a voltage measuring device 12 with a known configuration or structure, a communication device (power line modem) 13 with a known configuration or structure based on a power line communication (PLC) technique, a storage device 14 with a known configuration or structure that stores an identification number (an ID number) of the distribution abnormality detecting device 11 or the like, and a power transmission/reception cut-off device 15 with a known configuration or structure.

In the first embodiment, a power packet is configured such that the identification information is integrated with the partitioned power. Here, the identification information corresponds to the header portion of the power packet, and the partitioned power corresponds to the payload portion of the power packet. Further, for example, [$n^{th}$ identification information (a header portion 81)], [$n^{th}$ partitioned power (a payload portion 82)], [$(n+1)^{th}$ identification information (the header portion 81)], [$(n+1)^{th}$ partitioned power (the payload portion 82)], [$(n+2)^{th}$ identification information (the header portion 81)], and [$(n+2)^{th}$ partitioned power (the payload portion 82)] sequentially flow through the distribution line 20 during distribution of power as illustrated in FIG. 2(A). The length (for example, corresponding to the number of bytes) of the header portion 81 of the power packet and the length (for example, corresponding to power energy) of the payload portion 82 are inherently arbitrary, and can be set to desired values. In the first embodiment, the length of the header portion 81 is 64 bytes but is not limited to this example. The header portion 81 functions as a sort of tag. The length of the payload portion 82 is set to 10 kilowatts (a voltage value and a current value: when $V_{PLD}$ is 6600 volts, $I_{PLD}$ is 1.515 amperes, and when $V_{PLD}$ is 200 volts, $I_{PLD}$ is 50 amperes). Here, when an alternating current flows through the distribution line 20, a voltage value is an effective voltage value. Further, the interval specified by the partitioned power is a constant time interval (specifically, $T_0$=1 second interval in the first embodiment). In other words, in a steady state, the identification information (the header portion 81) appears at $T_0$-second intervals. Alternatively, the partitioned power (power energy) is constant. Alternatively, the interval specified by the partitioned power is the power packet length (the time length corresponding to the sum of the header portion 81 and the payload portion 82 in the first embodiment; a constant amount).

Further, when the interval of the identification information detected during power distribution is different from the interval specified by the partitioned power, that is, when an identification information interval abnormality has occurred, the distribution abnormality detecting device 11 determines (decides) that a distribution abnormality has occurred. Here, the voltage measuring device 12 detects a voltage value corresponding to the identification information (the header portion 81 of the power packet).

Specifically, the distribution abnormality detecting device 11 sequentially stores the appearance of the identification information (header information) in the storage device 14, and the distribution abnormality detecting device 11 determines that a distribution abnormality has occurred when a state in which the identification information (header information) does not appear at $T_0$ second intervals occurs once (when the identification information (header information) appears at intervals of $T_1$ seconds>$T_0$ seconds in the example of FIG. 2(B)), when the state has continuously occurred twice or more, or when the state has occurred twice or more within a given time. Specifically, voltage values $V_{PLD}$ and $V_{HDR}$ of power flowing through the distribution line 20 are measured by the voltage measuring device 12, and the distribution abnormality detecting device 11 measures a time interval at which the voltage value $V_{HDR}$ appears. Then, when the distribution abnormality detecting device 11 determines that a distribution abnormality has occurred, that is, when the state in which the voltage value $V_{HDR}$ measured by the voltage measuring device 12 does not appear at $T_0$ second intervals has occurred, the distribution abnormality detecting device 11 transmits information representing that a distribution abnormality has occurred to the distribution abnormality detecting device 11 positioned upstream therefrom through a communication device 13 and a wired communication line 21. Here, the wired communication line 21 is embodied by the distribution line 20. For example, when a distribution abnormality (for example, power stealing or abnormal leak) has occurred between the distribution abnormality detecting device $11_2$ and the distribution abnormality detecting device $11_3$, this abnormality is detected by the distribution abnormality detecting device $11_3$, and the distribution abnormality detecting device $11_2$ is notified thereof. The distribution abnormality detecting device $11_2$ operates the power transmission/reception cut-off device 15 to suspend distribution of power from the distribution abnormality detecting device $11_2$ to the distribution abnormality detecting device $11_3$ or causes the distribution abnormality detecting device $11_2$ to suspend reception of power from the distribution abnormality detecting device $11_1$.

The distribution abnormality detecting device according to the first embodiment detects the identification information during power distribution. Further, when part of the identification information is lost from power which is being distributed due to a certain reason (for example, power stealing or abnormal leak), a phenomenon that the interval of the identification information detected by the distribution abnormality detecting device is larger than an original interval or the detected interval of the identification information is different from the interval specified by the partitioned power occurs. Thus, the distribution abnormality detecting device can easily determine the occurrence of the distribution abnormality, and since the detected interval of the identification information is a sort of digital amount, the occurrence of an abnormality during power distribution can be instantaneously stably detected.

Second Embodiment

Figure 3:
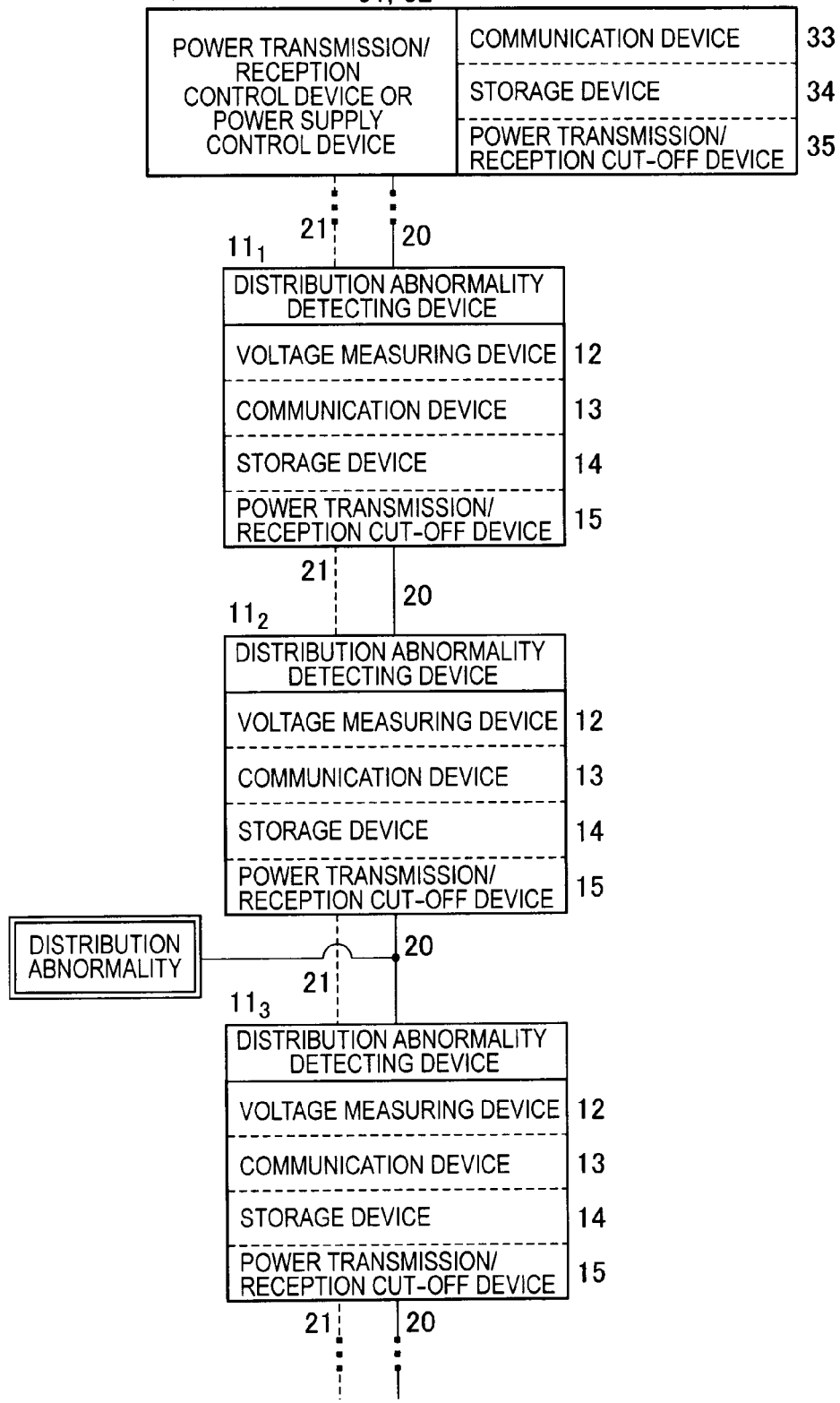
FIG. 3 is a conceptual diagram of a power transmission and reception control device and a power supply control device or the like according to a second embodiment.

The second embodiment relates to the power transmission and reception control device of the present disclosure and power supply control device. FIG. 3 is a conceptual diagram of a power transmission and reception control device and a power supply control device or the like according to the second embodiment. A power transmission and reception control device 31 according to the second embodiment is a power transmission and reception control device that can transmit and receive the partitioned power with the identification information, and the power supply control device 32 of the second embodiment is a power supply control device that supplies the partitioned power with the identification information and includes the distribution abnormality detecting device 11 described in the first embodiment. When the interval of the identification information detected by the distribution abnormality detecting device 11 is different from the interval specified by the partitioned power, that is, when an identification information interval abnormality has occurred, the power transmission and reception control device 31 or the power supply control device 32 controls transmission and reception of power or supply of power. Specifically, when the distribution abnormality detecting device 11 determines (decides) that a distribution abnormality has occurred, a power transmission/reception cut-off device 35 with a known configuration and structure is operated to suspend distribution or reception of power.

The power transmission and reception control device 31 or the power supply control device 32 may further include a packet disassembly circuit that extracts power from the payload portion in the power packet supplied from the outside and extracts the identification information from the header portion, a secondary battery that charges power supplied from the outside, a power generating device that generates power to be supplied to a power receiving facility/device based on power supplied from the outside or the secondary battery, a packet synthesizing circuit that generates a power packet in which the identification information extracted from the header portion of the power packet extracted by the packet disassembly circuit is included in a header portion thereof, and a distribution path storage device that stores a distribution network (a distribution path) through which the power packet is transmitted to a power receiving facility/device.

The distribution abnormality detecting device 11 is arranged at the position distant from the power transmission and reception control device 31 or the power supply control device 32. Further, the power transmission and reception control device 31 or the power supply control device 32 includes a communication device 33, and can acquire a determination result representing that a distribution abnormality has occurred by the distribution abnormality detecting device 11 from the distribution abnormality detecting device 11 via the communication line 21. The power transmission and reception control device 31 or the power supply control device 32 further includes a storage device 34 and stores an identification number of the distribution abnormality detecting device 11. Further, the power transmission and reception control device 31 or the power supply control device 32 receives an identification number of the distribution abnormality detecting device 11 that has determined that a distribution abnormality has occurred from the distribution abnormality detecting device 11 via the communication line 21, and stores the received identification number in the storage device 34. Thus, the power transmission and reception control device 31 or the power supply control device 32 can identify the distribution line 20 between one distribution abnormality detecting device 11 and another distribution abnormality detecting device 11 in which a distribution abnormality has occurred.

Here, the distribution abnormality detecting device 11 may transmit information representing that the detected interval of the identification information is different from the interval specified by the partitioned power, that is, that an identification information interval abnormality has occurred, to the power transmission and reception control device 31 or the power supply control device 32, and the power transmission and reception control device 31 or the power supply control device 32 may determine whether or not a distribution abnormality has occurred.

Even in the power transmission and reception control device or the power supply control device according to the second embodiment, the distribution abnormality detecting device that detects the identification information during power distribution is provided. Thus, when part of the identification information is lost from power which is being distributed due to a certain reason, for example, due to power stealing or abnormal leak, a phenomenon that the interval of the identification information detected by the distribution abnormality detecting device is larger than an original interval or the detected interval of the identification information is different from the interval specified by the partitioned power occurs. Thus, the power transmission and reception control device or the power supply control device can easily determine that a distribution abnormality has occurred.

Third Embodiment

Figure 4:
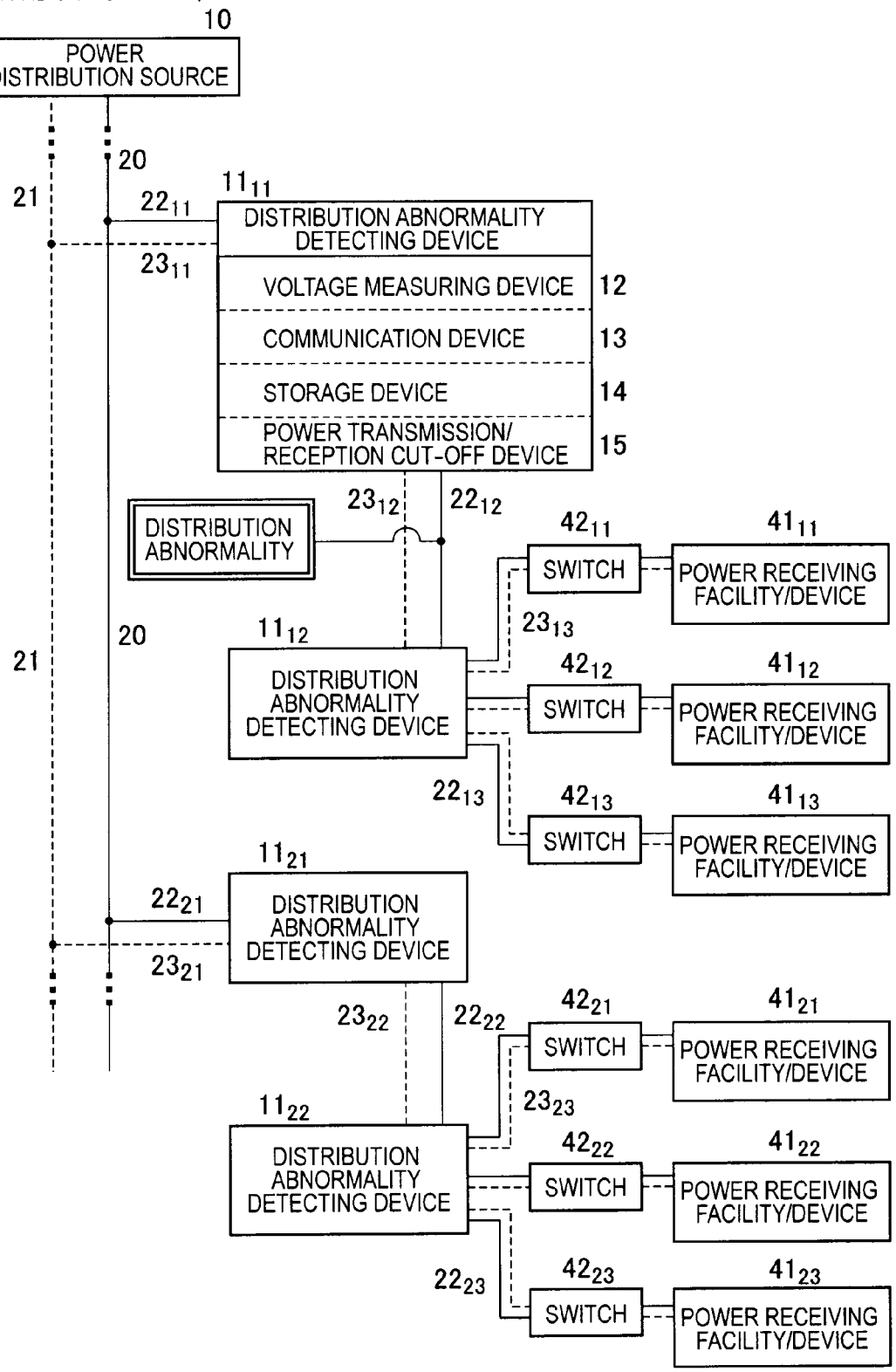
FIG. 4 is a conceptual diagram of a power transmission and reception control device and a power supply control device or the like according to a third embodiment.

A third embodiment is a modified example of the first embodiment or the second embodiment. FIG. 4 is a conceptual diagram of a distribution abnormality detecting device, a power transmission and reception control device and a power supply control device or the like according to the third embodiment.

In the third embodiment, a plurality of low-voltage distribution lines (branch distribution line and incoming lines) 22 are bifurcated and extend from the distribution line (high-voltage distribution line) 20. Further, for example, distribution abnormality detecting devices $11_{11}$ and $11_{12}$ are integrated into the low-voltage distribution line $22_{11}$, $22_{12}$, and $22_{13}$, and power receiving facilities/devices $41_{11}$, $41_{12}$, and $41_{13}$ are connected to a distribution abnormality detecting device $11_{12}$ through switches $42_{11}$, $42_{12}$, and $42_{13}$, respectively. Similarly, distribution abnormality detecting devices $11_{21}$ and $11_{22}$ are integrated into low-voltage distribution line $22_{21}$, $22_{22}$, and $22_{23}$, and power receiving facilities/devices $41_{21}$, $41_{22}$, and $41_{23}$ are connected to a distribution abnormality detecting device $11_{22}$ through switches $42_{21}$, $42_{22}$, and $42_{23}$, respectively. Here, the switch may be installed inside the distribution abnormality detecting device.

The storage device 14 installed in the distribution abnormality detecting device $11_{12}$ stores power receiving facility/device information (specifically, the identification number of the power receiving facility/device assigned to the power receiving facility/device) of the power receiving facilities/devices $41_{11}$, $41_{12}$, and $41_{13}$. The power receiving facilities/devices $41_{11}$, $41_{12}$, and $41_{13}$ transmit the power receiving facility/device information stored in the power receiving facilities/devices $41_{11}$, $41_{12}$, and $41_{13}$ to the distribution abnormality detecting device $11_{12}$ via a communication line $23_{13}$ at predetermined time intervals, and thus the distribution abnormality detecting device $11_{12}$ is constantly aware of the fact that the power receiving facilities/devices $41_{11}$, $41_{12}$, and $41_{13}$ are connected. Further the power receiving facility/device information related to the power receiving facility/device $41_{13}$ is assumed to include information representing that suspension of power supply is inhibited.

Similarly, the storage device 14 installed in the distribution abnormality detecting device $11_{22}$ stores the power receiving facility/device information (the identification number of the power receiving facility/device) of the power receiving facilities/devices $41_{21}$, $41_{22}$, and $41_{23}$. The power receiving facilities/devices $41_{21}$, $41_{22}$, and $41_{23}$ transmit the power receiving facility/device information stored in the power receiving facility/devices $41_{21}$, $41_{22}$, and $41_{23}$ to the distribution abnormality detecting device $11_{22}$ via a communication line $23_{23}$ at predetermined time intervals, and thus the distribution abnormality detecting device $11_{22}$ is constantly aware of the fact that the power receiving facilities/devices $41_{21}$, $41_{22}$, and $41_{23}$ are connected.

Here, a distribution abnormality is assumed to occur in a portion of the low-voltage distribution line $22_{12}$ between the distribution abnormality detecting device $11_{11}$ and the distribution abnormality detecting device $11_{12}$. Similarly to the first embodiment, the distribution abnormality is detected by the distribution abnormality detecting device $11_{12}$, and it is determined (decided) that a distribution abnormality has occurred. In this case, the distribution abnormality detecting device $11_{12}$ suspends supply of power to the power receiving facility/device based on the power receiving facility/device information stored in the storage device 14. Specifically, under control of the distribution abnormality detecting device $11_{12}$, the switches $42_{11}$ and $42_{12}$ in a closed state enter an open state via the communication line $23_{13}$, and thus supply of power to the power receiving facility/devices $41_{11}$ and $41_{12}$ is suspended. Meanwhile, the power receiving facility/device information related to the power receiving facility/device $41_{13}$ includes information representing that suspension of power supply is inhibited, and thus the switch $42_{13}$ remains in the closed state, and power is continuously supplied to the power receiving facility/device $41_{13}$.

Even in the third embodiment, similarly to the second embodiment, the distribution abnormality detecting device 11 may transmit the information representing that the detected interval of the identification information is different from the interval specified by the partitioned power, that is, the information representing that an identification information interval abnormality has occurred, to the power transmission and reception control device 31 or the power supply control device 32, and the power transmission and reception control device 31 or the power supply control device 32 may determine whether or not a distribution abnormality has occurred. In this case, a control command for supply of power to the power receiving facility/device is preferably transmitted to the distribution abnormality detecting device 11 that has detected that an identification information interval abnormality has occurred.

Fourth Embodiment

Figure 5:
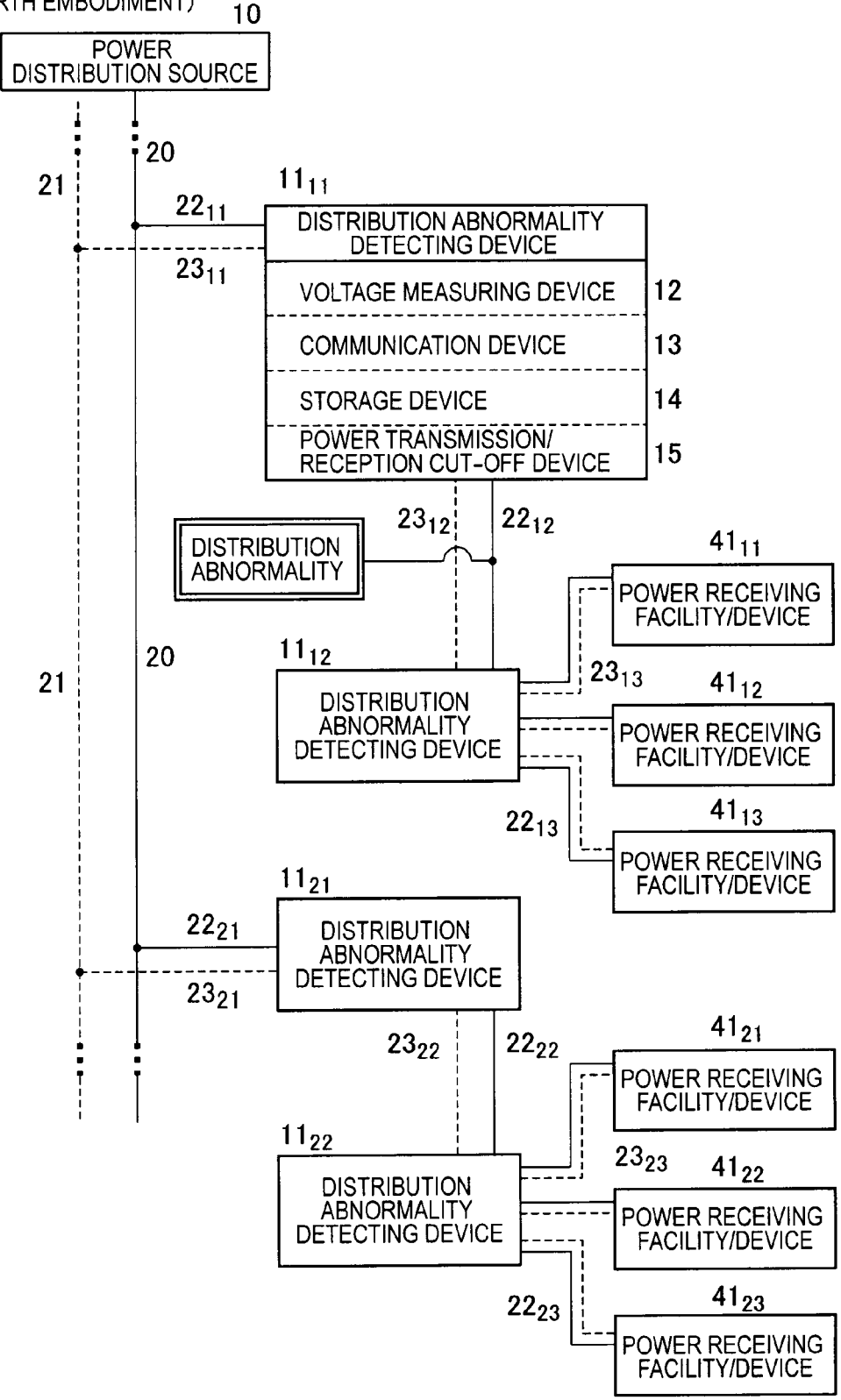
FIG. 5 is a conceptual diagram of a power transmission and reception control device and a power supply control device or the like according to a fourth embodiment.

A fourth embodiment is also a modified example of the first embodiment or the second embodiment. FIG. 5 is a conceptual diagram of a distribution abnormality detecting device, a power transmission and reception control device, and a power supply control device or the like according to the fourth embodiment.

Even in the fourth embodiment, a plurality of low-voltage distribution lines 22 are bifurcated and extended from the distribution line (high-voltage distribution line) 20. Further, for example, distribution abnormality detecting devices $11_{11}$ and $11_{12}$ are integrated into low-voltage distribution lines $22_{11}$, $22_{12}$, and $22_{13}$, and power receiving facilities/devices $41_{11}$, $41_{12}$, and $41_{13}$ are connected to a distribution abnormality detecting device $11_{12}$. Similarly, distribution abnormality detecting devices $11_{21}$ and $11_{22}$ are integrated into low-voltage distribution lines $22_{21}$, $22_{22}$, and $22_{23}$, and power receiving facilities/devices $41_{21}$, $41_{22}$, and $41_{23}$ are connected to a distribution abnormality detecting device $11_{22}$.

In the fourth embodiment, the identification information includes the power receiving facility/device information. When it is allowed to suspend supply of power to all of power receiving facilities/devices connected to the distribution abnormality detecting device, for example, the power receiving facility/device information is set to "1." However, when there is a power receiving facility/device for which suspension of power supply should be inhibited among power receiving facilities/devices connected to the distribution abnormality detecting device, for example, the power receiving facility/device information is set to "0." Further, the identification information includes an identification number (an ID number) of a distribution abnormality detecting device connected to the corresponding power receiving facility/device.

Here, a distribution abnormality is assumed to occur in a portion of the low-voltage distribution line $22_{12}$ between the distribution abnormality detecting device $11_{11}$ and the distribution abnormality detecting device $11_{12}$. Similarly to the first embodiment, the distribution abnormality is detected by the distribution abnormality detecting device $11_{12}$, and it is determined (decided) that a distribution abnormality. In this case, the distribution abnormality detecting device $11_{12}$ decomposes and analyzes the header portion (identification information) of the received power packet through a packet disassembly circuit (not shown), and checks whether or not an identification number (an ID number) of the distribution abnormality detecting device $11_{12}$ is included in the header portion (identification information) of the received power packet. When the identification number (the ID number) of the distribution abnormality detecting device $11_{12}$ is included, it is analyzed whether the power receiving facility/device information in the header portion (identification information) of the power packet is "0" or "1." When the power receiving facility/device information in the header portion (identification information) of the power packet is "1," the power transmission/reception cut-off device 15 is operated to suspend supply of power to the power receiving facility/devices $41_{21}$, $41_{22}$, and $41_{23}$. However, when the power receiving facility/device information in the header portion (identification information) of the power packet is "0," power is continuously supplied to the power receiving facilities/devices $41_{21}$, $41_{22}$, and $41_{23}$. When the identification number (the ID number) of the distribution abnormality detecting device $11_{12}$ is not included, the power transmission/reception cut-off device 15 is operated to suspend supply of power to the power receiving facility/devices $41_{21}$, $41_{22}$, and $41_{23}$.

Even in the fourth embodiment, similarly to the second embodiment, the distribution abnormality detecting device 11 may transmit the information representing that the detected interval of the identification information is different from the interval specified by the partitioned power, that is, the information representing that an identification information interval abnormality has occurred, to the power transmission and reception control device 31 or the power supply control device 32, and the power transmission and reception control device 31 or the power supply control device 32 may determine whether or not a distribution abnormality has occurred. In this case, a control command for supply of power to the power receiving facility/device is preferably transmitted to the distribution abnormality detecting device 11 that has detected that an identification information interval abnormality has occurred.

Fifth Embodiment

Figure 6:
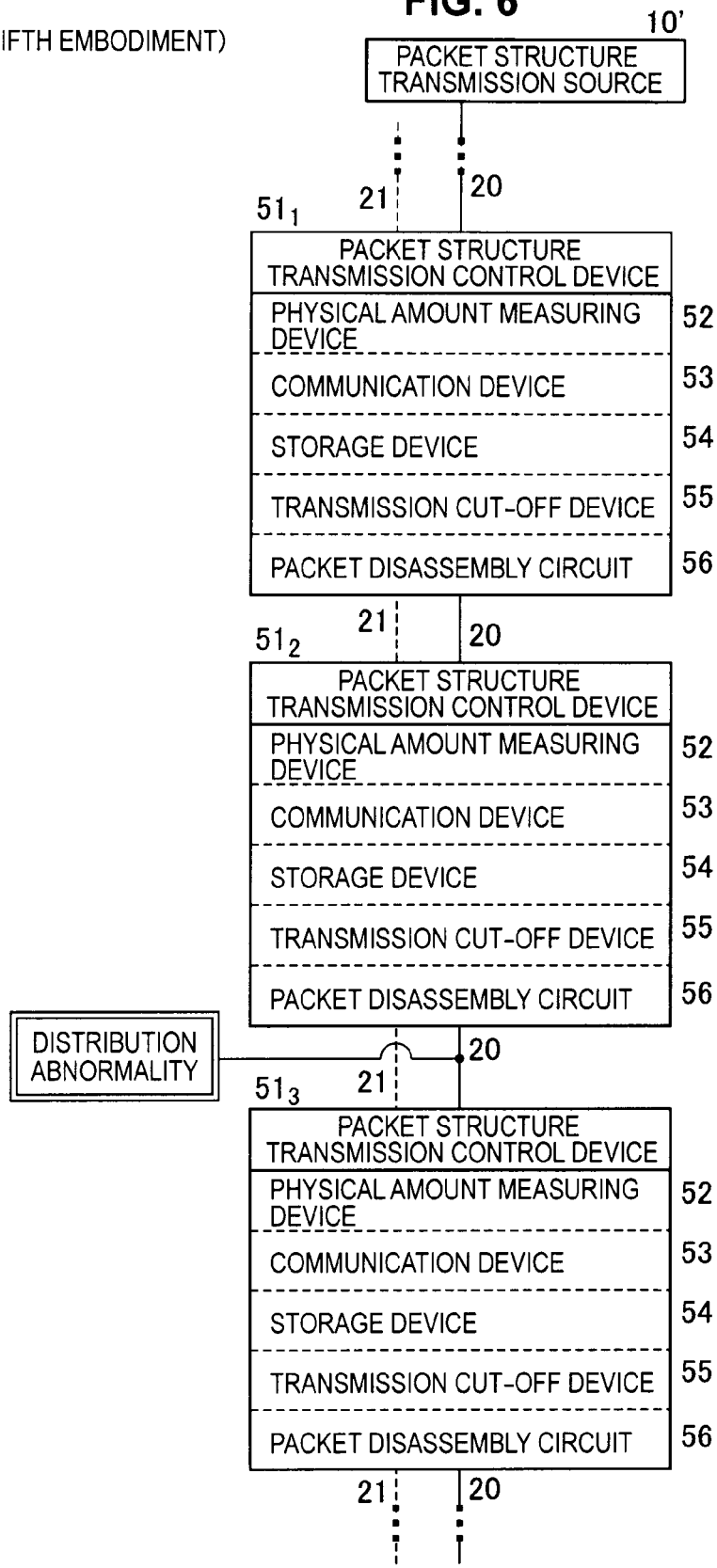
FIG. 6 is a conceptual diagram of a packet structure transmission control device or the like according to a fifth embodiment.
Figure 7:
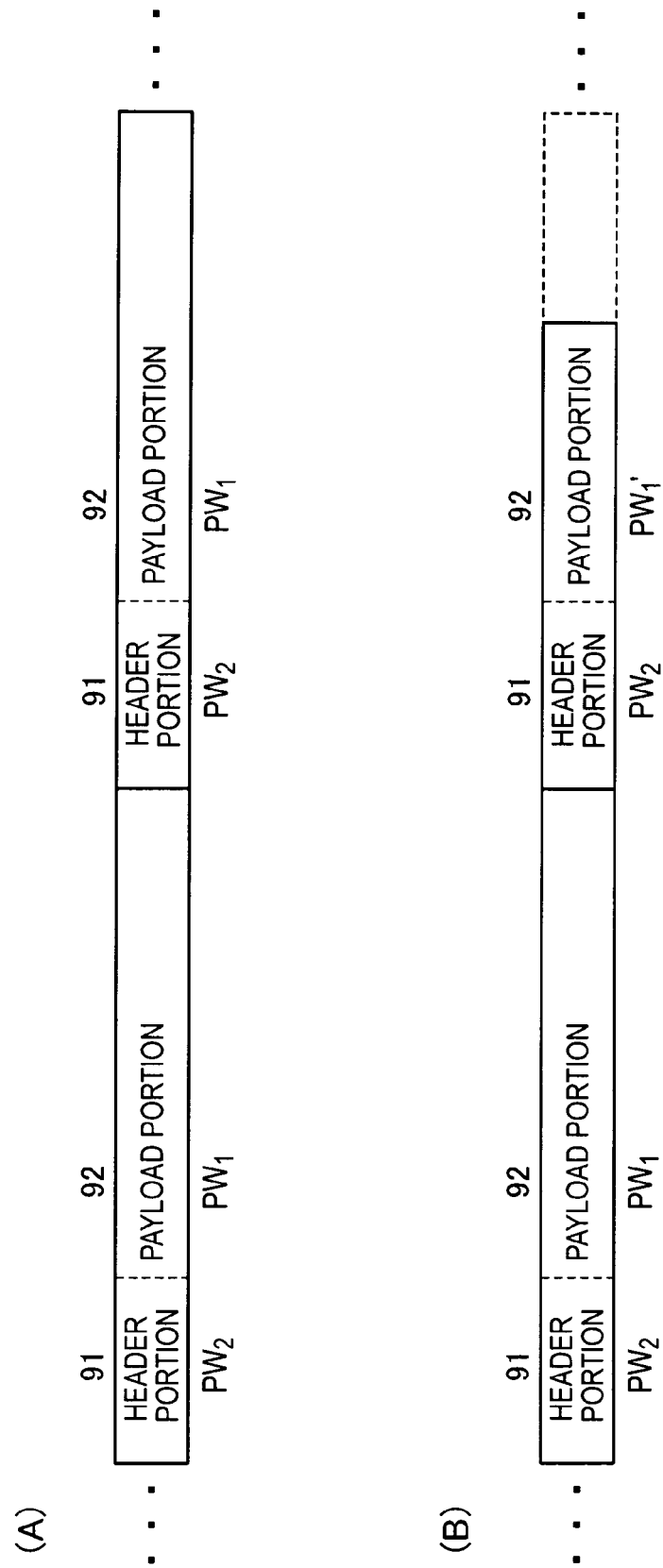
FIGS. 7(A) and 7(B) are conceptual diagrams of a packet structure.

A fifth embodiment relates to a packet structure transmission control device of the present disclosure. FIG. 6 is a conceptual diagram of a packet structure transmission control device or the like according to the fifth embodiment. FIGS. 7(A) and 7(B) are conceptual diagrams of a packet structure. A packet structure transmission control device 51 according to the fifth embodiment is a packet structure transmission control device that controls transmission of a packet structure configured with:

(A) a payload specified by a physical amount; and (B) header information including a payload length of the payload.

When data based on the payload length of the payload (payload amount of actually measured payload) obtained by the packet structure transmission control device 51 does not match data related to the payload length (numerical data) in the header information obtained by the packet structure transmission control device 51, the packet structure transmission control device 51 determines (decides) that an abnormality has occurred in transmission of the packet structure.

Here, in the fifth embodiment, specifically, the payload specified by the physical amount is power energy, and the header information includes a value (numerical data) of power energy which is the payload length of the payload.

The packet structure transmission control device 51 (packet structure transmission control devices $51_1$, $51_2$, and $51_3$ in the example of FIG. 6) according to the fifth embodiment is integrated into the distribution line (high-voltage distribution line) 20 at predetermined distance intervals. In other words, the packet structure (specifically, power packet) from the distribution line 20 is caused to pass through the inside of the packet structure transmission control device 51, and then header information is directly detected by the packet structure transmission control device 51. Alternatively, the packet structure transmission control device 51 is installed at the position adjacent to the distribution line 20, and indirectly detects the header information from the packet structure flowing through the distribution line 20. The packet structure which is the power packet from a known packet structure transmission source (for example, a power generating station or a power substation) 10' is transmitted to the distribution line 20.

The packet structure transmission control device 51 according to the fifth embodiment includes a physical amount measuring device (specifically, a power measuring device with a known configuration or structure) 52, a communication device (power line modem) 53 with a known configuration or structure based on the PLC technique, a storage device 54 with a known configuration or structure that stores an identification number (an ID number)

of the packet structure transmission control device 51 or the like, a transmission cut-off device 55 with a known configuration or structure, and a packet disassembly circuit 56 with a known configuration or structure.

In the fifth embodiment, as illustrated in FIG. 7(A), in transmission of the packet structure, for example, [$n^{th}$ header information 91], [an $n^{th}$ partitioned payload portion 92], [$(n+1)^{th}$ header information 91], [an $(n+1)^{th}$ partitioned payload portion 92], [$(n+2)^{th}$ header information 91], and [an $(n+2)^{th}$ partitioned payload portion 92)] sequentially flow through the distribution line 20. The length (corresponding, for example, the number of bits, the number of bytes, or the time length) of the header information 91 and the physical amount (corresponding to power energy) of the payload portion 92 are inherently arbitrary, and can be set to desired values.

In the packet structure transmission control device 51, the physical amount measuring device (power measuring device) 52 measures the payload specified by the physical amount, that is, power energy $PW_1$. Meanwhile, the packet disassembly circuit 56 decomposes and analyzes the packet structure and obtains a value (numerical data) $PW_2$ of the power energy which is the payload length of the payload. Here, a voltage value in the header information 91 has a combination of a high value and a low value. In other words, a voltage value in the header information 91 has two- or more-bit binary data. Further, the packet structure transmission control device 51 compares data (specifically, the value $PW_1$ of actually measured power energy) based on the payload length of the payload with data (specifically, numerical data $PW_2$ of power energy) related to the payload length in the header information, and determines that an abnormality has occurred in transmission of the packet structure when the values $PW_1$ and $PW_2$ do not match each other, that is, when a payload length mismatch occurs. In other words, as illustrated in FIG. 7(B), when a transmission abnormality (for example, power stealing or abnormal leak) has occurred and then the value of the power energy $PW_1$ has been reduced to $PW_1'$, a mismatch with data (specifically, the numerical data $PW_2$ of the power energy) related to the payload length in the header information occurs. Further, when this phenomenon is detected by, for example, the packet structure transmission control device $51_3$, the packet structure transmission control device $51_3$ transmits information representing that a transmission abnormality has occurred to the packet structure transmission control device $51_2$ through the communication device 13 and the communication line 21. The packet structure transmission control device $51_2$ controls transmission of the packet structure. Specifically, the packet structure transmission control device $51_2$ operates the transmission cut-off device 55 to suspend transmission of the packet structure from the packet structure transmission control device $51_2$ to the packet structure transmission control device $51_3$ or suspend transmission of the packet structure from the packet structure transmission control device $51_2$ to the packet structure transmission control device $51_1$.

In the packet structure transmission control device according to the fifth embodiment, when the data based on the payload length of the payload does not match the data related to the payload length in the header information, because it is determined that an abnormality has occurred in transmission of the packet structure, the occurrence of an abnormality during transmission can instantaneously stably be detected.

Sixth Embodiment

Figure 8:
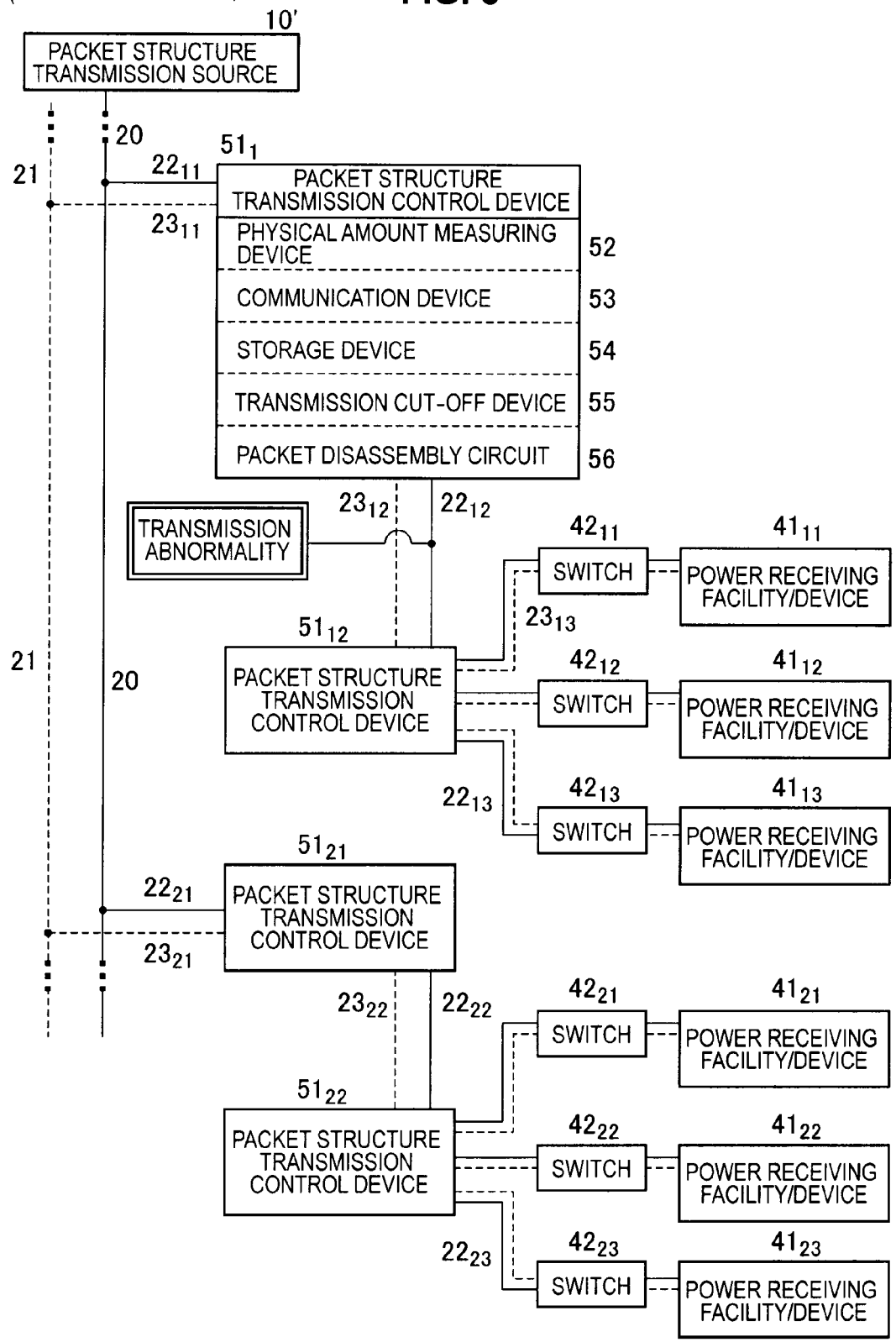
FIG. 8 is a conceptual diagram of a packet structure transmission control device or the like according to a sixth embodiment.

A sixth embodiment is a modified example of the fifth embodiment. FIG. 8 is a conceptual diagram of a packet structure transmission control device or the like according to the sixth embodiment.

In the sixth embodiment, similarly to the third embodiment, a plurality of low-voltage distribution lines 22 are bifurcated and extended from the distribution line (high-voltage distribution line) 20. Further, for example, packet structure transmission control devices $51_{11}$ and $51_{12}$ are integrated into low-voltage distribution lines $22_{11}$, $22_{12}$, and $22_{13}$, and power receiving facilities/devices $41_{11}$, $41_{12}$, and $41_{13}$ are connected to a packet structure transmission control device $51_{12}$ through switches $42_{11}$, $42_{12}$, and $42_{13}$, respectively. Similarly, packet structure transmission control devices $51_{21}$ and $51_{22}$ are integrated into low-voltage distribution line $22_{21}$, $22_{22}$, and $22_{23}$, and power receiving facilities/devices $41_{21}$, $41_{22}$, and $41_{23}$ are connected to a packet structure transmission control device $51_{22}$ through switches $42_{21}$, $42_{22}$, and $42_{23}$, respectively. Here, the switch may be installed inside the packet structure transmission control device.

The storage device 54 installed in the packet structure transmission control device $51_{12}$ stores power receiving facility/device information (specifically, the identification number of the power receiving facility/device assigned to the power receiving facility/device in advance) of the power receiving facilities/devices $41_{11}$, $41_{12}$, and $41_{13}$. The power receiving facility/devices $41_{11}$, $41_{12}$, and $41_{13}$ transmit the power receiving facility/device information stored in the power receiving facility/devices $41_{11}$, $41_{12}$, and $41_{13}$ to the packet structure transmission control device $51_{12}$ via the communication line $23_{13}$ at predetermined time intervals, and the packet structure transmission control device $51_{12}$ is constantly aware of the fact that the power receiving facility/devices $41_{11}$, $41_{12}$, and $41_{13}$ are connected. The power receiving facility/device information related to the power receiving facility/device $41_{13}$ is assumed to include information representing that suspension of transmission of the packet structure is inhibited.

Similarly, the storage device 54 installed in the packet structure transmission control device $51_{22}$ stores the power receiving facility/device information (the identification number of the power receiving facility/device) of the power receiving facilities/devices $41_{21}$, $41_{22}$, and $41_{23}$. The power receiving facility/devices $41_{21}$, $41_{22}$, and $41_{23}$ transmit the power receiving facility/device information stored in the power receiving facilities/devices $41_{21}$, $41_{22}$, and $41_{23}$ to the packet structure transmission control device $51_{22}$ via the communication line $23_{23}$ at predetermined time intervals, and the packet structure transmission control device $51_{22}$ is constantly aware of the fact that the power receiving facility/devices $41_{21}$, $41_{22}$, and $41_{23}$ are connected.

Here, the transmission abnormality of the packet structure is assumed to occur in a portion of the low-voltage distribution line $22_{12}$ between the packet structure transmission control device $51_{11}$ and the packet structure transmission control device $51_{12}$. Similarly to the fifth embodiment, the transmission abnormality is detected by the packet structure transmission control device $51_{12}$, and it is determined (decided) that a transmission abnormality has occurred. In this case, the packet structure transmission control device $51_{12}$ suspends transmission of the packet structure to the power receiving facility/device based on the power receiving facility/device information stored in the storage device 54. Specifically, under control of the packet structure transmission control device $51_{12}$, the switches $42_{11}$ and $42_{12}$ in a closed state enter an open state via the communication line $23_{13}$, and thus transmission of the packet structure to the power receiving facilities/devices $41_{11}$ and $41_{12}$ is suspended. Meanwhile, the power receiving facility/device information related to the power receiving facility/device $41_{13}$ includes information representing that suspension of power supply is inhibited, and thus the switch $42_{13}$ remains in the closed state, and power is continuously supplied to the power receiving facility/device $41_{13}$.

Seventh Embodiment

Figure 9:
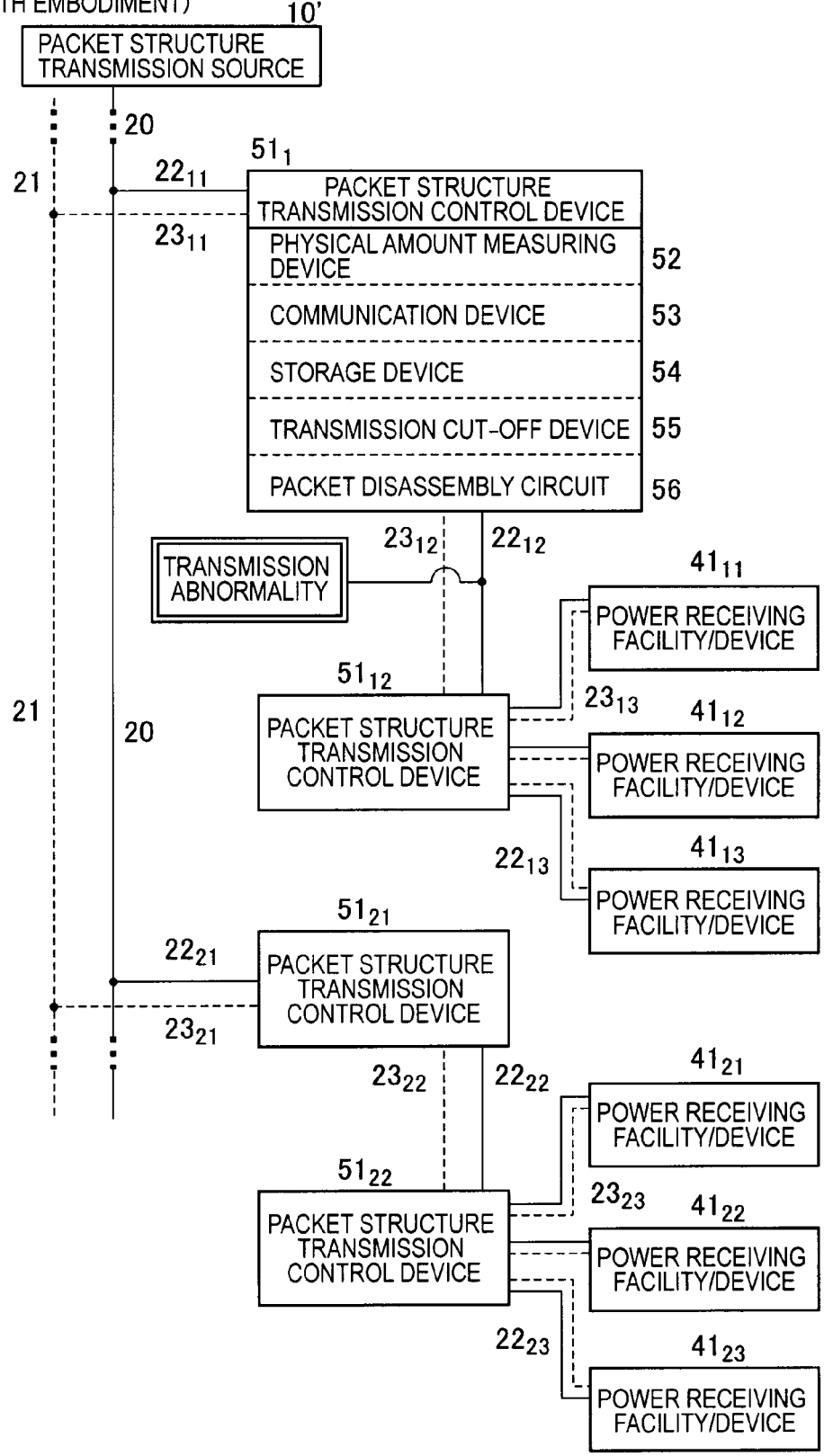
FIG. 9 is a conceptual diagram of a packet structure transmission control device or the like according to a seventh embodiment.

A seventh embodiment is also a modified example of the fifth embodiment. FIG. 9 is a conceptual diagram of a packet structure transmission control device or the like according to the seventh embodiment.

Even in the seventh embodiment, a plurality of low-voltage distribution lines 22 are bifurcated and extended from the distribution line (high-voltage distribution line) 20. Further, for example, packet structure transmission control devices $51_{11}$ and $51_{12}$ are integrated into low-voltage distribution lines $22_{11}$, $22_{12}$, and $22_{13}$, and power receiving facilities/devices $41_{11}$, $41_{12}$, and $41_{13}$ are connected to a packet structure transmission control device $51_{12}$. Similarly, packet structure transmission control devices $51_{21}$ and $51_{22}$ are integrated into low-voltage distribution lines $22_{21}$, $22_{22}$, and $22_{23}$, and power receiving facilities/devices $41_{21}$, $41_{22}$, and $41_{23}$ are connected to a packet structure transmission control device $51_{22}$.

In the seventh embodiment, the identification information includes the power receiving facility/device information. When it is allowed to suspend transmission of the packet structure to all of power receiving facilities/devices connected to the packet structure transmission control device, for example, the power receiving facility/device information is set to "1." However, when there is a power receiving facility/device in which suspension of transmission of the packet structure is inhibited among power receiving facilities/devices connected to the packet structure transmission control device, for example, the power receiving facility/device information is set to "0." Further, the identification information includes an identification number (an ID number) of a packet structure transmission control device connected to the corresponding power receiving facility/device.

Here, a transmission abnormality is assumed to occur in a portion of the low-voltage distribution line $22_{12}$ between the packet structure transmission control device $51_{11}$ and the packet structure transmission control device $51_{12}$. Similarly to the fifth embodiment, the transmission abnormality is detected by the packet structure transmission control device $51_{12}$, and it is determined (decided) that a transmission abnormality has occurred. In this case, the packet structure transmission control device $51_{12}$ decomposes and analyzes the header information of the received packet structure through the packet disassembly circuit 56, and checks whether or not the identification number (the ID number) of the packet structure transmission control device $51_{12}$ is included in the header information of the received packet structure. When the identification number (the ID number) of the packet structure transmission control device $51_{12}$ is included, it is analyzed whether the power receiving facility/device information in the header information of the packet structure is "1" or "0." When the power receiving facility/device information in the header information of the packet structure is "1," the transmission cut-off device 55 is operated to suspend transmission of the packet structure to the power receiving facility/devices $41_{21}$, $41_{22}$, and $41_{23}$. However, when the power receiving facility/device information in the header information of the packet structure is "0," the packet structure is continuously transmitted to the power receiving facility/devices $41_{21}$, $41_{22}$, and $41_{23}$. When the identification number (the ID number) of the packet structure transmission control device $51_{12}$ is not included, the transmission cut-off device 55 is operated to suspend transmission of the packet structure to the power receiving facility/devices $41_{21}$, $41_{22}$, and $41_{23}$.

The exemplary embodiments of the present disclosure have been described above, but the present disclosure is not limited to the above embodiments. The configurations and structures of the distribution abnormality detecting device, the power transmission and reception control device, the power supply control device, and the packet structure transmission control device described in the above embodiments are exemplar and can appropriately be changed. Further, the configurations of power, the power packet, and the packet structure are exemplary and can appropriately be changed.

Additionally, the present application may also be configured as below.

[1] <<Distribution abnormality detecting device>>

A distribution abnormality detecting device that detects a distribution abnormality of partitioned power with identification information, the distribution abnormality detecting device being configured to:

determine that the distribution abnormality has occurred when an interval of the identification information detected during power distribution is different from an interval specified by the partitioned power.

[2] The distribution abnormality detecting device according to [1], wherein the interval specified by the partitioned power is a constant time interval.

[3] The distribution abnormality detecting device according to [1], wherein the partitioned power is constant.

[4] The distribution abnormality detecting device according to [1], wherein a power packet is configured such that the identification information is integrated with the partitioned power, the identification information corresponds to a header portion of the power packet, and the partitioned power corresponds to a payload portion of the power packet.

[5] The distribution abnormality detecting device according to [4], wherein the interval specified by the partitioned power is a power packet length.

[6] The distribution abnormality detecting device according to any one of [1] to [5], wherein, when it is determined that the distribution abnormality has occurred, distribution or reception of power is suspended.

[7] The distribution abnormality detecting device according to any one of [1] to [5], wherein, when it is determined that the distribution abnormality has occurred, supply of power to a power receiving facility or device is suspended based on power receiving facility or device information included in the identification information.

[8] The distribution abnormality detecting device according to [7], wherein the power receiving facility or device information included in the identification information includes information of a power receiving facility or device for which suspension of power supply is to be inhibited.

[9] The distribution abnormality detecting device according to any one of [1] to [5], further including:
a storage device,
wherein, when it is determined that the distribution abnormality has occurred, supply of power to a power receiving facility or device is suspended based on power receiving facility or device information stored in the storage device.

[10] The distribution abnormality detecting device according to [9],
wherein the power receiving facility or device information includes information of a power receiving facility or device for which suspension of power supply is to be inhibited.

[11]<<Power transmission and reception control device>>
A power transmission and reception control device that transmits and receives partitioned power with identification information, including:
a distribution abnormality detecting device that detects identification information during power distribution,
wherein transmission and reception of power are controlled when an interval of the identification information detected by the distribution abnormality detecting device is different from an interval specified by the partitioned power.

[12]<<power supply control device>>
A power supply control device that supplies partitioned power with identification information, including:
a distribution abnormality detecting device that detects identification information during power distribution,
wherein supply of power is controlled when an interval of the identification information detected by the distribution abnormality detecting device is different from an interval specified by the partitioned power.

[13]<<Packet structure transmission control device>>
A packet structure transmission control device that controls transmission of a packet structure that contains (A) a payload specified by a physical amount and (B) header information including a payload length of the payload, wherein the packet structure transmission control device determines that an abnormality has occurred in transmission of the packet structure when data that is based on the payload length of the payload obtained by the packet structure transmission control device does not match data related to the payload length in the header information obtained by the packet structure transmission control device.

[14] The packet structure transmission control device according to [13],
wherein transmission of the packet structure is controlled when it is determined that an abnormality has occurred in transmission of the packet structure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A distribution abnormality detecting device, configured to:
detect a first identification information in a power packet during power distribution;
detect a second identification information in the power packet, wherein the second identification information is next to the first identification information in the power packet;
determine an interval between the detection of the first identification information and the detection of the second identification information, wherein the determined interval corresponds to a first interval of a partitioned power detected during the power distribution, wherein the partitioned power is interposed between the detected first identification information and the detected second identification information;
detect a second interval specified by the partitioned power interposed between the detected first identification information and the detected second identification information; and
determine that a distribution abnormality has occurred in the power distribution in an event the determined first interval of the partitioned power detected during the power distribution is different from the second interval specified by the partitioned power.

2. The distribution abnormality detecting device according to claim 1,
wherein the second interval specified by the partitioned power is a constant time interval.

3. The distribution abnormality detecting device according to claim 1,
wherein the partitioned power is constant.

4. The distribution abnormality detecting device according to claim 1,
wherein the power packet is configured such that the first identification information and the second identification information are integrated with the partitioned power,
wherein the first identification information and the second identification information correspond to header portions of the power packet, and
wherein the partitioned power corresponds to a payload portion of the power packet.

5. The distribution abnormality detecting device according to claim 4, wherein the second interval specified by the partitioned power is a power packet length.

6. The distribution abnormality detecting device according to claim 1, wherein, in an event it is determined that the distribution abnormality has occurred, distribution or reception of power is suspended.

7. The distribution abnormality detecting device according to claim 1, wherein, in an event it is determined that the distribution abnormality has occurred, supply of power to a power receiving facility or device is suspended based on power receiving facility or device information included in the first identification information and the second identification information.

8. The distribution abnormality detecting device according to claim 7, wherein the power receiving facility or device information included in the first identification information and the second identification information includes information of the power receiving facility or device for which suspension of power supply is to be inhibited.

9. The distribution abnormality detecting device according to claim 1, further comprising:
a storage device,
wherein, in an event it is determined that the distribution abnormality has occurred, supply of power to a power receiving facility or device is suspended based on power receiving facility or device information stored in the storage device.

10. The distribution abnormality detecting device according to claim 9, wherein the power receiving facility or device information includes information of the power receiving facility or device for which suspension of power supply is to be inhibited.

11. A power transmission and reception control device, comprising:
a distribution abnormality detecting device configured to:
detect a first identification information in a power packet during power distribution;
detect a second identification information in the power packet, wherein the second identification information is next to the first identification information in the power packet;
determine an interval between the detection of the first identification information and the detection of the second identification information, wherein the determined interval corresponds to a first interval of a partitioned power detected during the power distribution, wherein the partitioned power is interposed between the detected first identification information and the detected second identification information; and
detect a second interval specified by the partitioned power interposed between the detected first identification information and the detected second identification information,
wherein transmission and reception of power are controlled in an event the determined first interval of the partitioned power detected during the power distribution is different from the second interval specified by the partitioned power.

12. A power supply control device, comprising:
a distribution abnormality detecting device configured to:
detect a first identification information in a power packet during power distribution;
detect a second identification information in the power packet, wherein the second identification information is next to the first identification information in the power packet;
determine an interval between the detection of the first identification information and the detection of the second identification information, wherein the determined interval corresponds to a first interval of a partitioned power detected during the power distribution, wherein the partitioned power is interposed between the detected first identification information and the detected second identification information; and
detect a second interval specified by the partitioned power interposed between the detected first identification information and the detected second identification information,
wherein supply of power is controlled in an event the determined first interval of the partitioned power detected during the power distribution is different from the second interval specified by the partitioned power.

* * * * *